United States Patent [19]

Segaud

[11] Patent Number: 5,673,995

[45] Date of Patent: Oct. 7, 1997

[54] SUPPORT ELEMENT FOR A MOTOR VEHICLE INDICATING DISPLAY, AND A METHOD OF MAKING IT

[75] Inventor: Daniel Segaud, Paris, France

[73] Assignee: Valeo Management Services, Propriété Indus., Créteil, France

[21] Appl. No.: 278,985

[22] Filed: Jul. 22, 1994

Related U.S. Application Data

[63] Continuation of Ser. No. 780,703, Aug. 27, 1992, abandoned.

[30] Foreign Application Priority Data

Sep. 2, 1991 [FR] France .................................. 91 10837

[51] Int. Cl.[6] ........................................... B60Q 1/26
[52] U.S. Cl. ........................... 362/83.3; 362/61; 362/800; 362/84; 362/249; 362/252
[58] Field of Search ........................ 362/23, 61, 83.3, 362/249, 252, 84, 382, 800; 40/552, 541, 596; 439/110, 111, 77

[56] References Cited

U.S. PATENT DOCUMENTS

| | | |
|---|---|---|
| 3,694,902 | 10/1972 | Apgar et al. . |
| 3,735,117 | 5/1973 | Hunt .................................... 362/249 |
| 4,173,035 | 10/1979 | Hoyt .................................... 362/249 |
| 4,404,621 | 9/1983 | Mauro .................................. 362/249 |
| 4,742,432 | 5/1988 | Thillays et al. . |
| 4,984,057 | 1/1991 | Mii . |
| 5,003,443 | 3/1991 | Sabala ................................. 362/249 |
| 5,053,931 | 10/1991 | Rushing .............................. 362/249 |

FOREIGN PATENT DOCUMENTS

| | | |
|---|---|---|
| 2106074 | 4/1972 | France . |
| 2481563 | 4/1980 | France . |
| 0253244 | 4/1991 | United Kingdom . |

*Primary Examiner*—Thomas M. Sember

[57] ABSTRACT

A support element for an indicating display for a motor vehicle carries a multiple component electronic circuit. The support element comprises a plurality of fingers or thongs which are separated from each other by slots, with a plurality of the components of the electronic circuit being mounted on each finger. The support element is made by cutting so as to produce the fingers joined to at least one root portion of the support element.

13 Claims, 2 Drawing Sheets

SUPPORT ELEMENT FOR A MOTOR VEHICLE INDICATING DISPLAY, AND A METHOD OF MAKING IT

This is a continuation of application Ser. No. 07/780,703, filed on Sept. 27, 1992 abandoned.

FIELD OF THE INVENTION

The present invention is concerned in general terms with a support element carrying a multiple component electronic circuit, in particular for an indicating display for a motor vehicle. The invention also relates to a method of making such a support element. The support elements referred to are especially suitable for the equipment of motor vehicle indicating displays of a new generation.

BACKGROUND OF THE INVENTION

As is well known, an indicator display of conventional design is in the form of a unit comprising at least one reflector in which an incandescent or fluorescent lamp is mounted, and further comprising a transparent glass or globe which is mounted inside the reflector.

Such a display is relatively thick, and gives rise to problems of adapting it to the support on which it has to be mounted, this support being usually a corner of the vehicle or a wing. In general terms, the bulbs or other light sources are fragile, and also have a fairly short working life and a high energy consumption. For this reason, there have already been proposals for indicator displays which are compact, and which employ as the light source a semi-conductor light emitting assembly in the form, for example, of electroluminescent diodes. Such arrangements enable the above mentioned disadvantages of conventional displays to be overcome and offer the possibility of providing, for example, illuminating diodes giving light in both of the colours (red and orange) that are conventionally used in motor vehicle indications, while at the same time being uncoloured when extinguished. This enables an indicator display of uniform appearance to be obtained.

A display of this kind is described for example in the specification of U.S. Pat. No. 4 742 432 and the corresponding French published patent application FR 2 574 616A, in which the electroluminescent diodes are mounted on a flat support element which is overlaid with an electronic circuit consisting of multiple components, with an optical collimating element being mounted over the said diodes. In practice this optical collimating element has a plurality of reflective parabolic cavities which are extended in insulating cylindrical openings that engage closely within conductive rings forming part of the diodes, until the insulating lower face of the said optical element comes into abutment on the support.

When the display is of non-planar, complex shape, the collimating element has to be shaped accordingly.

A problem then arises because the support element, equipped with its multiple component electronic circuit, cannot easily be subsequently reshaped to conform with the shape of the collimating element, since the components of the circuit are arranged on a three-dimensional network of components due to the complex shape of the support element.

DISCUSSION OF THE INVENTION

An object of the present invention is to overcome this drawback.

According to the invention in a first aspect, a support element carrying a multiple component electronic circuit, in particular for a motor vehicle indicating display, is characterised in that it includes fingers or thongs separated from each other by slots, and in that a plurality of the said multiple components is mounted on each of the said fingers or thongs. In one embodiment, this support element is generally comb-shaped.

The electronic components are preferably in the form of electroluminescent diodes.

A support element in accordance with the invention has the advantage of being able to assume any surface shape whatever, including a surface which curves in different directions.

According to the invention in a second aspect, a method of making a support element according to any one of the preceding Claims is characterised in that, starting with a flat support element equipped with its multiple component electronic circuit, multiple cuts are made in the said support element over a portion of its length so as to form fingers or thongs which remain attached by at least one of their ends to a root portion of the said element.

Preferably, in a second step of this method, the material of the fingers is permanently deformed in such a way that they will then be aligned along a curve defined on the complex surface of the component that is associated with the support element. In a variant, starting with a support element at least one portion of which is in the shape of a comb, the second step in the method of manufacture comprises permanently deforming the tongues where the length of the latter has first been so calculated that, once they are permanently deformed, they will be aligned along a curve defined along the associated complex surface.

The present invention enables a simple method of assembling the components in the flat, in order to create a three-dimensional circuit, to be preserved.

In the case of an indicating display for a motor vehicle, the support element is fitted with discrete light sources which are located on portions of the support element that will subsequently become fingers of the latter, and also in a portion extending the fingers, i.e. in the root portion of the support element. This permits the assembly, in the same operation, of additional components forming part of the display, for giving functions such as multiplexing of the control of illumination of the display, and/or display of a symbol or character or characters by suitable illumination of individual light sources of the display.

It will be appreciated that the use of metallic substrates as the primary support is compatible with the invention, such metallic substrates acting as heat transfer means for the removal of heat that is necessary for satisfactory operation of the electronics.

The invention also gives wide scope for choice of positioning of the light sources with the precision which is called for in terms of their optical alignment with respect to the outer envelope of the indicating display. The position of the said light sources may be calculated by a computer, their physical location being obtained with the use of slots, notches or the like formed on the fingers of the support element.

It will be appreciated that the light sources may be sandwiched between the support element and its associated element of complex shape, for example the associated collimating element.

It will also be appreciated that the arrangement in accordance with the invention is applicable universally, so that the fingers may be arranged horizontally, or vertically (for example in the case of an estate car or station wagon), or obliquely.

The optical collimating element is preferably formed with bands aligned with the fingers of the support element, with the said bands being then arranged either horizontally, vertically or obliquely like the fingers.

The invention enables the optical element to be mechanically robust and easy to make, and the electroluminescent diodes may be located at the optical focus or optical centre of the holes formed through the said optical element.

The width of the fingers may be constant, or may vary from one end of each finger to the other. The width of the fingers may also be different as between one finger and another.

The shape of the fingers may be obtained with or without the aid of optical centring means.

The position of the root portion of the support element may be at one end of the latter, or in the middle, or off centre. In this last case the fingers may extend in two directions. It is also possible to provide more than two root portions.

This arrangement also enables a variety of components to be fitted, namely discrete light sources with ohmic resistances, and/or power components, connecting elements, microprocessors, or infra-red emitting and/or receiving components.

The support element may be of any suitable material, for example an insulating plastics material or an insulating metallic substrate.

The electronic circuit may comprise a rigid or semi-rigid printed circuit.

The method of cutting the fingers may be of the mechanical type (e.g. sawing) or may consist of laser cutting, shearing, or punching.

Preferred embodiments of the invention will be described below, in the context of an indicating display for a motor vehicle by way of example only, and with reference to the accompanying drawings.

DESCRIPTION OF PREFERRED EMBODIMENTS OF THE INVENTION

Figure 1:
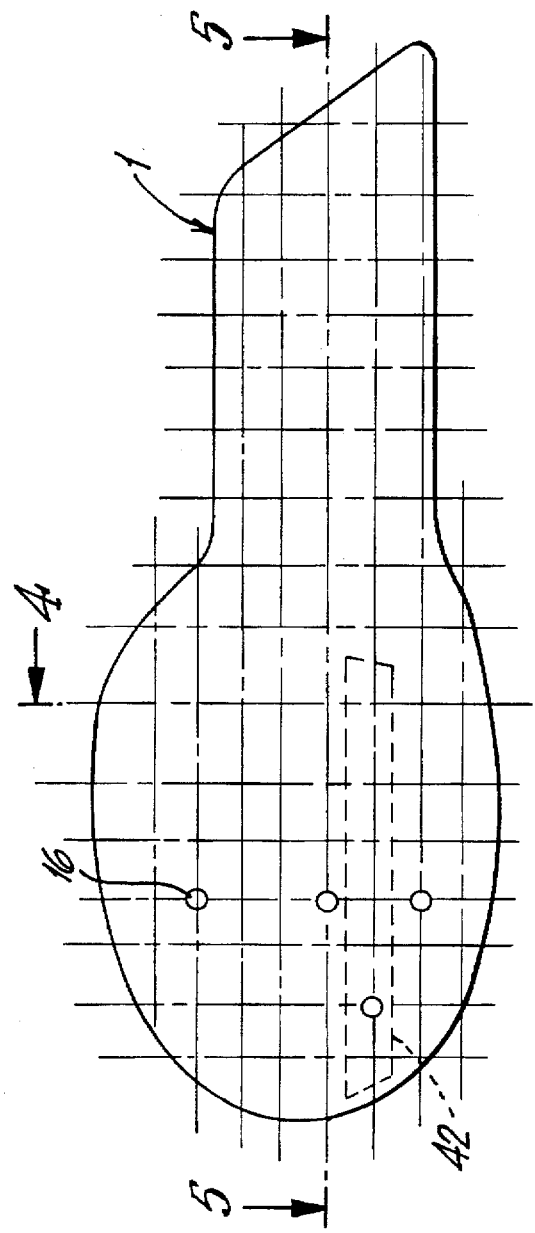
FIG. 1 is a diagrammatic front view of the optical collimating element associated with the support element in accordance with the invention.

The drawings show a support element 4 carrying an electronic circuit having multiple components 2 and 3 for an indicating display for a motor vehicle, having a non-planar and complex shape.

The support element 4 carries discrete light sources 3 in the form of discrete electroluminescent elements or discrete opto-electronic elements. These light sources will be taken in the remainder of this description to be electroluminescent diodes, and will be referred to as such, it being understood that this designation is non-limiting in terms of the scope of the invention.

Similarly, the expression "support element", or insulating support, is to be understood in this specification to mean a component made of an electrically insulating material such as the elements 1 and 4 and the support 6 to be described below.

Figure 6:
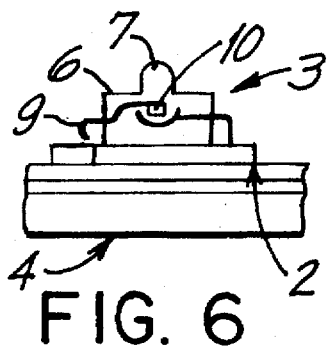
FIG. 6 is a view seen in the direction of the arrow 6 in FIG. 2, showing an electroluminescent diode.

As is shown in FIG. 1 of French patent publication No. FR 2 481 563A and in FIG. 6 of the drawings of this present Application, each electroluminescent diode 3 includes a support 6 carrying electrical supply terminals 8 and 9, together with a semi-conductor light emitter 10 and a projecting block 7 of encapsulating material, referred to here as a capsule. The capsule 7 has a penetrating head and surrounds the light emitter 10. In this example one of the supply terminals, namely the terminal 8, is a cathode having a reflector surrounding the light emitter 10, the latter being in the form of a crystal. The other supply terminal 9 is an anode. The terminals 8 and 9 are, in this example, mostly set into the support 6, which in this example is of an electrically insulating material.

Figure 4:
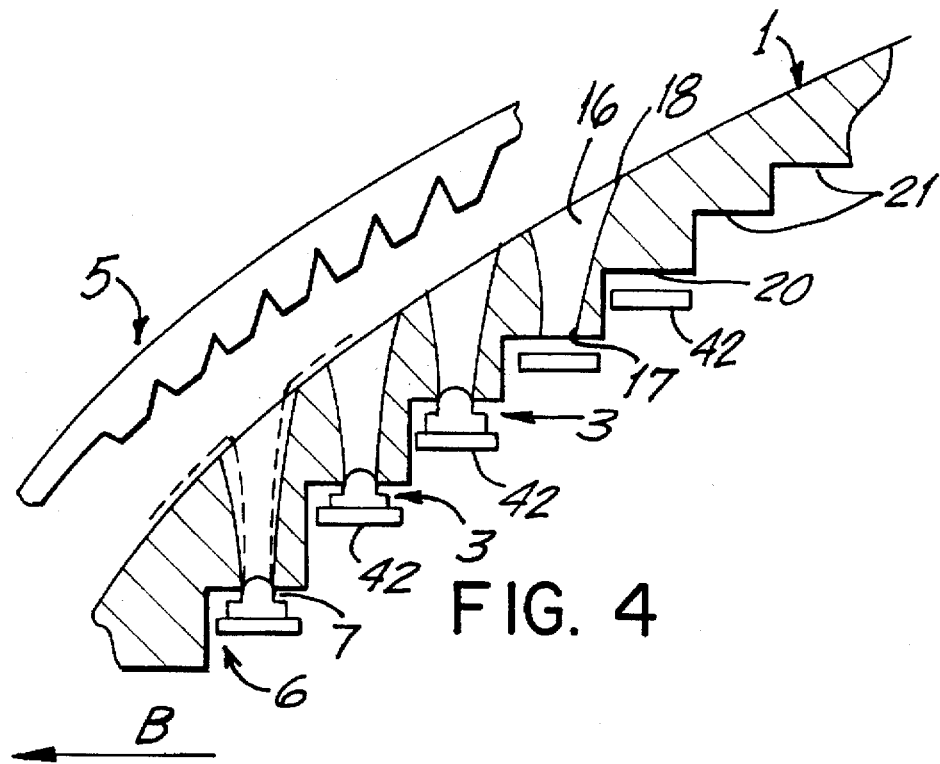
FIG. 4 is a view in cross section taken on the line 4—4 in FIG. 1.

In FIGS. 1 and 4 for example, a collimating element 1, which is here of an electrically insulating material, is associated with the support element 4. Like the latter, the collimating element has a complex or irregular shape. The respective shapes of the elements 1 and 4 are adapted so as to match each other. The collimating element 1 has a through hole 16 facing each capsule 7, so that there is a three-dimensional network of diodes 3 and holes 16. The supply terminals 8 and 9 of the diodes 3, and thus the diodes themselves, are interconnected through an electrical supply circuit 2. This circuit 2 is part of the electronic circuit carried by the support element 4. More precisely, it is carried by the front face of the latter that is directed towards the collimating element 1.

The support element 4, which is preferably made of an electrically insulating material, is thus overlaid by the electrical circuit 2. The circuit 2 is preferably applied by silk screen printing, in which a conductive ink is printed on to the front face of the element 4. However, in modified embodiments, it may be deposited electrochemically or electolytically.

In another modification, the electrical circuit may be formed in the manner described in the French patent publication No. FR 2 601 486A and the corresponding European patent publication No. EP 0 253 244A, with the aid of a flexible film which is applied adhesively on to the front face of the element 4 by means of an adhesive layer, with the said flexible film being coated with copper and tin. Such an arrangement can be seen in FIG. 6, in which the adhesive layer is shown in black.

The support element 4, carrying the electronic circuit with its multiple components 2 and 3 as described above, is formed with a plurality of long fingers or thongs 42, which are separated from each other. In addition, a plurality of electronic components are mounted on each of these fingers or thongs 42, at least some of these components being the electroluminescent diodes 3.

Figure 2:
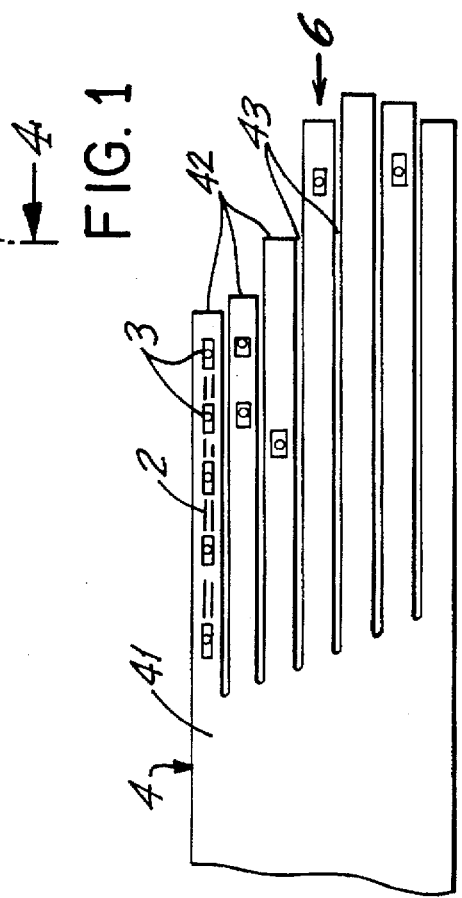
FIG. 2 is a diagrammatic view of the support element carrying other components and after being cut to form its fingers.

In the embodiment shown in FIG. 2, the support element 4 is generally in the form of a comb, in which the fingers 42 are separated from each other by slots 43. The fingers 42 are joined to a common root portion 41 at one end of the support element 4. The support element is made by taking a support element, in the form of a flat plate on which the electronic circuit comprising the various components 2, 3 has already been mounted, and making multiple cuts over part of its length so as to form the fingers 42, which remain attached to the root portion 41 through at least one of their ends.

It will be noted that in the example shown in FIG. 2, the fingers are attached at only one of their ends to the root portion 41, each of the other ends of the fingers being free.

In a second step in the method of making the support element, the fingers 42 are permanently deformed. The length of each finger 42 is calculated in advance in such a way that once they have been shaped by permanent deformation, the fingers become aligned with each other along a curve which is defined on the irregular surface with which they are associated. In this example, this irregular surface consists of bands 20 formed on the collimating element 1 (see FIG. 4), which will be described later in this description. In this example, the slots 43, together with the fingers 42, are made by mechanical sawing, or by laser cutting, mechanical shearing, or punching.

The bands 20 formed in the collimating element 1 are adapted to fit the fingers 42. The width of the bands is thus adapted to the width of the fingers 42, the width of the bands 20 being in this example greater than that of the fingers 42. Thus the rear face which is directed towards the element 4 and towards the fingers 42 (see FIG. 4) of the collimating element 1 is formed with steps 21. The bands 20 then serve to support the diodes 3 and constitute the horizontal part of the steps 21 as shown in FIG. 4. The bands 20 are separated from each other by vertical walls and act as ledges. The collimating element 1 can thus be seen to have both an optical function and a mechanical function, while being at the same time mechanically robust.

The holes 16 are open into these bands 20. In this example, the holes 16 extend transversely, with the back end of each one being of such a size as depends on the size of the capsule 7. The latter may be mounted either with or without a clearance in the associated hole 16. It will be noted that the holes 16 are flared, so that the front end 18 of each hole is larger in cross section than its rear end 17.

It will be appreciated that the rear end 17 of each through hole 16 is associated with a corresponding capsule 7, in such a way that the latter can easily be fitted in the hole without being damaged. As shown in the drawings, the capsule 7 has a penetrating nose of ogee shape, though it may of course be in the form of a half olive, or of any other suitable shape. The shape of its head, in general terms, is such as to enable the capsule to be fitted easily in the rear end 17 of the associated through hole 16, and to be centred in the latter. The capsule 7 of each diode 3 projects from the front face of its support 6, the shape of the latter being for example either cylindrical or rectangular.

Accordingly, the diodes 3 are of compact and inexpensive construction, with the width of the fingers or thongs 42 being adapted to the appropriate dimension of the diodes and other electronic components carried by the support element 4. The diodes 3 and other electronic components are fitted on the support element in portions of the latter that will subsequently become these fingers. It will be realised that the circuit 2 thus constitutes an image of the support element 4 and itself defines fingers.

The diodes 3 are secured for example by soldering or other suitable means in a melting oven, or by vacuum sputtering. Alternatively, they may be secured using a conductive adhesive paste of a kind which is subsequently polymerised. Any other fastening method may be used, for example induction heating or microwave heating, since all of the electronic components are readily surface mounted when the support element 4 is still flat, prior to its permanent deformation as described above.

It will be noted that the support element 4 is of insulating material, and may for example be of a suitable plastics material. In general terms, the support 4 is semi-rigid. It may however alternatively comprise an insulated metallic substrate. The support element 4 is adapted to be fixed to the bodywork of the motor vehicle, directly or indirectly.

The optical collimating element 1 is also of a suitable insulating material, with an irregular shape. It is preferably made of a suitable plastics material. The through holes 16 define axes of symmetry forming a rectangular grid as indicated in FIG. 1.

In the form shown in the drawings, the collimating element 1 is of a generally bulged shape. Its front face has a reflective coating 12, which may also be formed on the internal surface of the through holes 16. The coating 12 is preferably aluminium-based. The collimating element 1 itself is opaque. It is mechanically robust and, as will be seen from the foregoing description, it constitutes a reflector formed as a light guide with specially adapted front and rear faces, the front face having an optical function while the rear face has a mechanical support function.

In this example the bands 20 have a cylindrical surface profile, and they all extend parallel in cross section in a common direction B (see FIG. 4). Similarly therefore, the fingers or thongs 42 in this example also have a cylindrical shape after they have been deformed permanently. This deformation is carried out either with the aid of a suitable tool while the support element 4 is soft, or with the aid of the optical element 1 when the support element 4 is in a semi-rigid state.

It will be appreciated that it is easy to form the collimating optical element 1, and that stripping of the holes 16 from the mould poses no particular problem since these holes are of flared shape, which may be that of a surface of revolution of conic section. In this context, a conic section means a curve (such as an ellipse, a parabola, or a hyperbola for example) corresponding to the geometrical locus of the points for which the ratio of the distance from a focal point to the distance from a line referred to as a directrix has a given value. The holes 16 define a network of holes which, like the network of diodes 3, is three-dimensional.

Figure 5:
FIG. 5 is a diagrammatic view in cross section taken on the line 5—5 in FIG. 1.

The size of the front end 18 of each through hole 16 varies according to its position in the display. It is of course possible to space the holes 16 apart from each other by a greater or lesser amount, according to their position on the display, so as to give the best possible optical effect. Thus, as shown in FIG. 5, the axes of the holes 16 are inclined at an angle A, which varies according to the position of the hole in the display.

The diodes 3 generally define a matrix of diodes as shown in FIG. 1. They may be arranged to emit coloured light, for example red or orange, and the collimating optical element 1 is overlaid with a transparent member 5 which may be coloured, for example in a smoked colour, or in a plurality of colours such as amber or red, in accordance with the requirements of the manufacturer.

Besides the diodes 3, the electronic circuit may include power components, connecting elements, microprocessors, and components for emitting and/or receiving infra-red radiation. It is thus possible to provide a multiplexed control for illumination of the indicating displays, and for display of a character such as a letter, figure or symbol, simply by appropriate selective illumination of appropriate diodes 3.

As will have been understood, especially from the foregoing description and from the drawings, the diodes 3 may be located exactly at the focus of the corresponding through holes 16, in such a way that the display gives a high optical performance. After the fingers or thongs 42 have been deformed, the diodes 3 are sandwiched between the latter and the bands 20 of the collimating element 1.

Figure 3:
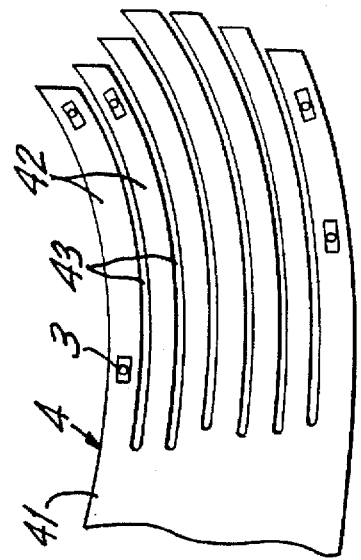
FIG. 3 is a view similar to FIG. 2 after permanent deformation of the fingers.

The present invention is of course not limited to the embodiment described above. In particular, the fingers 42 may extend in both directions away from the root portion 41 of the support element 4, and the position of the root portion will depend on particular applications. As shown in FIGS. 2 and 3, the root portion 41 is arranged at one end of the support element 4, but it will be understood that it can of course be arranged in the middle of the latter.

Figure 7:
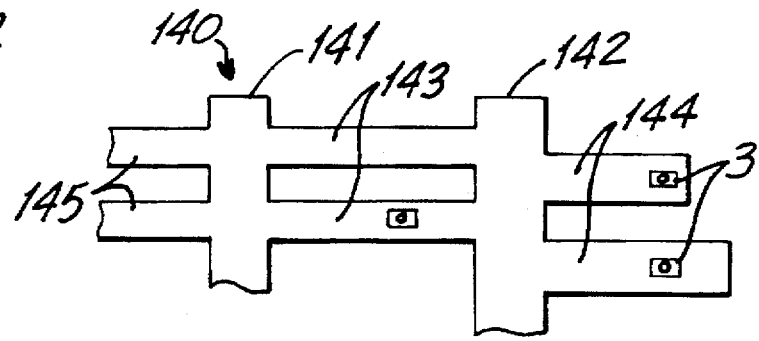
FIG. 7 shows a modification to the arrangement seen in FIG. 2.

The support element may have a plurality of root portions. In this connection reference is now made to FIG. 7, in which the support element is indicated by the reference numeral 140. In this example, the support element 140 has two root portions 141 and 142, together with three sets of fingers or thongs 145, 143, 144. The strips 143 extend between the two root portions 141 and 142, while the strips 144 and 145 are in the form of fingers having free ends extending in cantilevered fashion away from the respective root portions 142 and 141.

The lengths of the strips and root portions is of course so calculated that once they have been fashioned into their final shape, they will be aligned along a curve defined on their associated complex surface, such as the bands 20.

All of the foregoing depends on the shape of the indicating display. The width of at least one finger or strip may change from one end of the finger to the other, as may their length (see for example the strips 144 in FIG. 7). Their width may simply vary as between one finger and another. The same is true in respect of their length, which is governed generally by the designed shape of the display.

The optical collimating element 1 may be of any complex shape whatsoever, and may be made without a stepped surface for mounting the diodes 3.

The bands 20 and the fingers 42 may extend horizontally as shown in FIG. 1, but on the other hand they may alternatively extend vertically or obliquely.

The optical element I may serve for securing the indicating display on to the bodywork of the vehicle. It may for example be of hollow shape, with, on its rear face, a peripheral flange which envelops the support element 4 and which is provided with fastening means for securing it to the bodywork. In that case, the support element 4 is secured to the optical element 1 by means of its root portion 41 or root portions 141, 142.

The support element 4 may of course also be of hollow shape, having on its rear face a securing flange for fastening the indicating display to the bodywork of the vehicle. In this case its base is divided into fingers or thongs that are surrounded by the said securing flange. The optical collimating element is then secured to the support element 4 by means of the securing flange, and also to the transparent member 5.

As mentioned above, the support element 4 is preferably made of a semi-rigid material, so that the optical element 1 constitutes a template for the support element 4, with the fingers 42 being deformed so as to follow the shape of the bands 20 by cooperation of the diodes 3 with the bands 20.

The support element 4 can of course be made of a more flexible material, but in that case a separate special template must be provided for shaping it.

What is claimed:

1. A motor vehicle signal apparatus comprising a support element, an electronic circuit disposed on said support element, said electronic circuit including a plurality of components, said support element being formed from a deformable, electrically insulating material and including at least one root portion, a plurality of spaced apart fingers joined to said root portion, wherein at least some of said spaced apart fingers extend substantially in a common direction with a plurality of said fingers having their ends free and a predetermined cut length with said fingers being deformed in a manner substantially different from each other so as to define a three dimensional shape defined by the different fingers of the support, and wherein a plurality of said components are mounted on each finger, and a collimating element associated with the support element, wherein said collimating element has a three dimensional shape defined substantially by the shape of the support element.

2. A motor vehicle signal apparatus according to claim 1, wherein the said components include electroluminescent diodes.

3. A motor vehicle signal apparatus according to claim 1, comprising at least one comb-shaped portion.

4. A motor vehicle signal apparatus according to claim 1, wherein a width of at least one said finger varies from one end to another end.

5. A motor vehicle signal apparatus according to claim 1, wherein at least one finger is of different width from another said finger.

6. A method of making the support element according to claim 1, including the steps of taking a flat support element carrying its multiple component electronic circuit, and making multiple cuts through the support element over a part of its length so as to define the root portion and the plurality of fingers joined to the root portion.

7. A method according to claim 6 including the further step of then permanently deforming the fingers.

8. A motor vehicle signal apparatus according to claim 1 wherein said collimating element is formed from a rigid, opaque material.

9. A motor vehicle signal apparatus according to claim 1 wherein said collimating element includes bands adapted to fit the formed fingers of the support element.

10. A motor vehicle signal apparatus according to claim 9 wherein a width of the band is greater than a width of a respective finger.

11. A motor vehicle signal apparatus according to claim 9 wherein said bands are separated from each other by vertical walls.

12. A motor vehicle signal apparatus according to claim 11 wherein said collimating elements has holes for receiving elements on said support element.

13. A motor vehicle signal apparatus according to claim 1 wherein said collimating element has a front face and a reflective coating on the front face.

* * * * *

UNITED STATES PATENT AND TRADEMARK OFFICE
CERTIFICATE OF CORRECTION

PATENT NO. : 5,673,995
DATED : October 7, 1997
INVENTOR(S) : Daniel Segaud

It is certified that error appears in the above-identified patent and that said Letters Patent is hereby corrected as shown below:

Title Page, item [63], delete "780,703" and substitute -- 936,120 --.

Title Page, item [73], delete "Valeo Management Services, Propriété Indus., Créteil, France" and substitute -- Valeo Vision, Bobigny Cedes, France --.

Signed and Sealed this

First Day of September, 1998

Attest:

BRUCE LEHMAN

Attesting Officer

Commissioner of Patents and Trademarks